US012599012B2

(12) United States Patent
Schuderer et al.

(10) Patent No.: US 12,599,012 B2
(45) Date of Patent: Apr. 7, 2026

(54) FREE CONFIGURABLE POWER SEMICONDUCTOR MODULE

(71) Applicant: Hitachi Energy Ltd, Zürich (CH)

(72) Inventors: Juergen Schuderer, Zürich (CH); Slavo Kicin, Zürich (CH); Fabian Mohn, Ennetbaden (CH); Gernot Riedel, Baden-Rütihof (CH)

(73) Assignee: Hitachi Energy Ltd, Zurich (CH)

( * ) Notice: Subject to any disclaimer, the term of this patent is extended or adjusted under 35 U.S.C. 154(b) by 853 days.

(21) Appl. No.: 17/795,970

(22) PCT Filed: Jan. 28, 2021

(86) PCT No.: PCT/EP2021/052004
§ 371 (c)(1),
(2) Date: Jul. 28, 2022

(87) PCT Pub. No.: WO2021/152021
PCT Pub. Date: Aug. 5, 2021

(65) Prior Publication Data
US 2023/0116118 A1        Apr. 13, 2023

(30) Foreign Application Priority Data

Jan. 30, 2020      (EP) ..................................... 20154510

(51) Int. Cl.
*H01L 23/538*        (2006.01)
*H01L 23/00*        (2006.01)
(Continued)

(52) U.S. Cl.
CPC .... *H01L 23/5381* (2013.01); *H01L 23/49811* (2013.01); *H01L 23/49822* (2013.01);
(Continued)

(58) Field of Classification Search
CPC ........... H01L 23/5381; H01L 23/49811; H01L 23/49822; H01L 23/49833;
(Continued)

(56) References Cited

U.S. PATENT DOCUMENTS 10,163,868 B2     12/2018   Horio et al.
2008/0143379 A1 *   6/2008   Norman ................. H05K 1/029
                                              257/E23.079
(Continued)

FOREIGN PATENT DOCUMENTS

CN        102664177 A      9/2012
CN        105612690 A      5/2016
(Continued)

OTHER PUBLICATIONS

Hoene, Prof. Eckart, "ECPE Lighthouse Program msPEBB—modular and scalable Power Electronic Building Block", ECPE SiC & GaN User Forum, Munich, Germany, Mar. 2019, total 24 pages.
(Continued)

*Primary Examiner* — Julio J Maldonado
*Assistant Examiner* — Kenneth S. Stephenson
(74) *Attorney, Agent, or Firm* — Slater Matsil, LLP

(57) ABSTRACT

A power semiconductor module includes a semiconductor board and a number of semiconductor chips attached to the semiconductor board. Each semiconductor chip has two power electrodes. An adapter board is attached to the semiconductor board above the semiconductor chips. The adapter board includes a terminal area for each semiconductor chip on a side facing away from the semiconductor board. The adapter board, in each terminal area, provides a power terminal for each power electrode of the semiconductor chip associated with the terminal area. Each power terminal is electrically connected via a respective vertical post below the terminal area with a respective semiconduc-
(Continued)

tor chip and each of the power terminals has at least two plug connectors. Jumper connectors interconnect the plug connectors for electrically connecting power electrodes of different semiconductor chips.

20 Claims, 6 Drawing Sheets

(51) Int. Cl.
    *H01L 23/498*     (2006.01)
    *H01L 25/16*     (2023.01)

(52) U.S. Cl.
    CPC .. *H01L 23/49833* (2013.01); *H01L 23/49844* (2013.01); *H01L 23/49861* (2013.01); *H01L 23/5385* (2013.01); *H01L 23/5386* (2013.01); *H01L 23/5389* (2013.01); *H01L 24/16* (2013.01); *H01L 25/162* (2013.01); *H01L 2224/16227* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01)

(58) Field of Classification Search
    CPC ......... H01L 23/49844; H01L 23/49861; H01L 23/5385; H01L 23/5386; H01L 23/5389; H01L 24/16; H01L 25/162; H01L 2224/16227; H01L 2924/10253; H01L 2924/10272; H01L 2924/1203; H01L 2924/13055; H01L 2924/13091; H01L 24/72; H01L 2224/0603; H01L 2224/20; H01L 2224/32238; H01L 2224/73251; H01L 2224/8384; H01L 23/3735; H01L 25/072; H05K 1/0262; H05K 2201/10196; H05K 1/141; H05K 3/222; H05K 2201/042; H05K 2201/10151; H05K 2201/10166
    See application file for complete search history.

(56) References Cited

U.S. PATENT DOCUMENTS

| | | | |
|---|---|---|---|
| 2011/0102054 | A1 | 5/2011 | Domes |
| 2011/0121450 | A1 | 5/2011 | Tsukada et al. |
| 2017/0047923 | A1 | 2/2017 | Inaba et al. |
| 2017/0077068 | A1 | 3/2017 | Horio et al. |
| 2017/0112005 | A1 | 4/2017 | Cole et al. |
| 2019/0150268 | A1 | 5/2019 | Nakamura et al. |
| 2019/0304946 | A1 | 10/2019 | Cottet et al. |
| 2020/0375042 | A1 | 11/2020 | Tan et al. |

FOREIGN PATENT DOCUMENTS

| | | | |
|---|---|---|---|
| CN | 106887955 | A | 6/2017 |
| EP | 2146372 | A2 | 1/2010 |
| EP | 2871765 | A1 | 5/2015 |
| JP | 2005243713 | A | 9/2005 |
| JP | 2011114039 | A | 6/2011 |
| JP | 2018073923 | A | 5/2018 |
| JP | 2018531576 | A | 10/2018 |
| JP | 2019096508 | A | 6/2019 |
| WO | 2021151949 | A1 | 8/2021 |

OTHER PUBLICATIONS

Schuderer, J., et al., "Power module with exposed mold channels for online diagnostics", ABB, ZCRD Corporate Research, Rev. 1, Apr. 1, 2019, total 10 pages.
Ishibashi, H., et al., "Direct Power Board Bonding Technology for 3D Power Module Package", PCIM Europe 2018, Nuremberg, Germany, Jun. 5-7, 2018, total 5 pages.
Peters, D., et al., "CoolSiC Trench MOSFET Combining SiC Performance With Silicon Ruggedness", Power Electronics Europe, Silicon Carbide, Issue 3, Jun./Jul. 2017, total 4 pages.

* cited by examiner

Fig. 6

FREE CONFIGURABLE POWER SEMICONDUCTOR MODULE

CROSS-REFERENCE TO RELATED APPLICATIONS

This application is a national stage application of International Application No. PCT/EP2021/052004, filed on Jan. 28, 2021, which claims priority to European Patent Application No. 20154510.0, filed on Jan. 30, 2020, which applications are hereby incorporated herein by reference.

FIELD OF THE INVENTION

The invention relates to the field of power electronics and in particular embodiments to a power semiconductor module.

BACKGROUND

Multichip power semiconductor modules are usually designed for a defined topology (such as a half-bridge configuration) and may not allow to extract chip individual information, since the power semiconductor chips are connected and controlled in parallel. Complex topologies need be realized by using various individual modules. Power module terminals are typically limited to the basic connections that may not allow extraction of chip-individual diagnostics signals (such as on-board temperature and chip current).

US 2017/077 068 A1 shows a semiconductor module with a substrate to which chips are bonded and a printed circuit board, which is connected via electrical conductive posts with the substrate.

US 2019/150 268 A1 shows a semiconductor module. The semiconductor module has two substrates with switching elements on it, which are connected via vertical posts with a circuit board above, which connects the two substrates with each other. The circuit board comprises several electrically conductive areas, which are connected to the vertical posts.

US 2017/047 923 A1 shows a power semiconductor module with semiconductor switches on a substrate. One electrode of the semiconductor switches is connected via posts with a circuit board above the substrate.

US 2017/112 005 A1 relates to a power semiconductor module, which includes a number of sub-modules connected via removable jumpers. The removable jumpers allow connections between one or more power semiconductor switches in the sub-modules to be reconfigured.

SUMMARY

Embodiments of the invention can provide a configurable power semiconductor module with a small footprint and low stray inductance.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

FIG. 6 schematically shows a cross-section through a power semiconductor module according to a further embodiment of the invention.

The reference symbols used in the drawings, and their meanings, are listed in summary form in the list of reference symbols. In principle, identical parts are provided with the same reference symbols in the figures.

DETAILED DESCRIPTION OF ILLUSTRATIVE EMBODIMENTS

Figure 1:
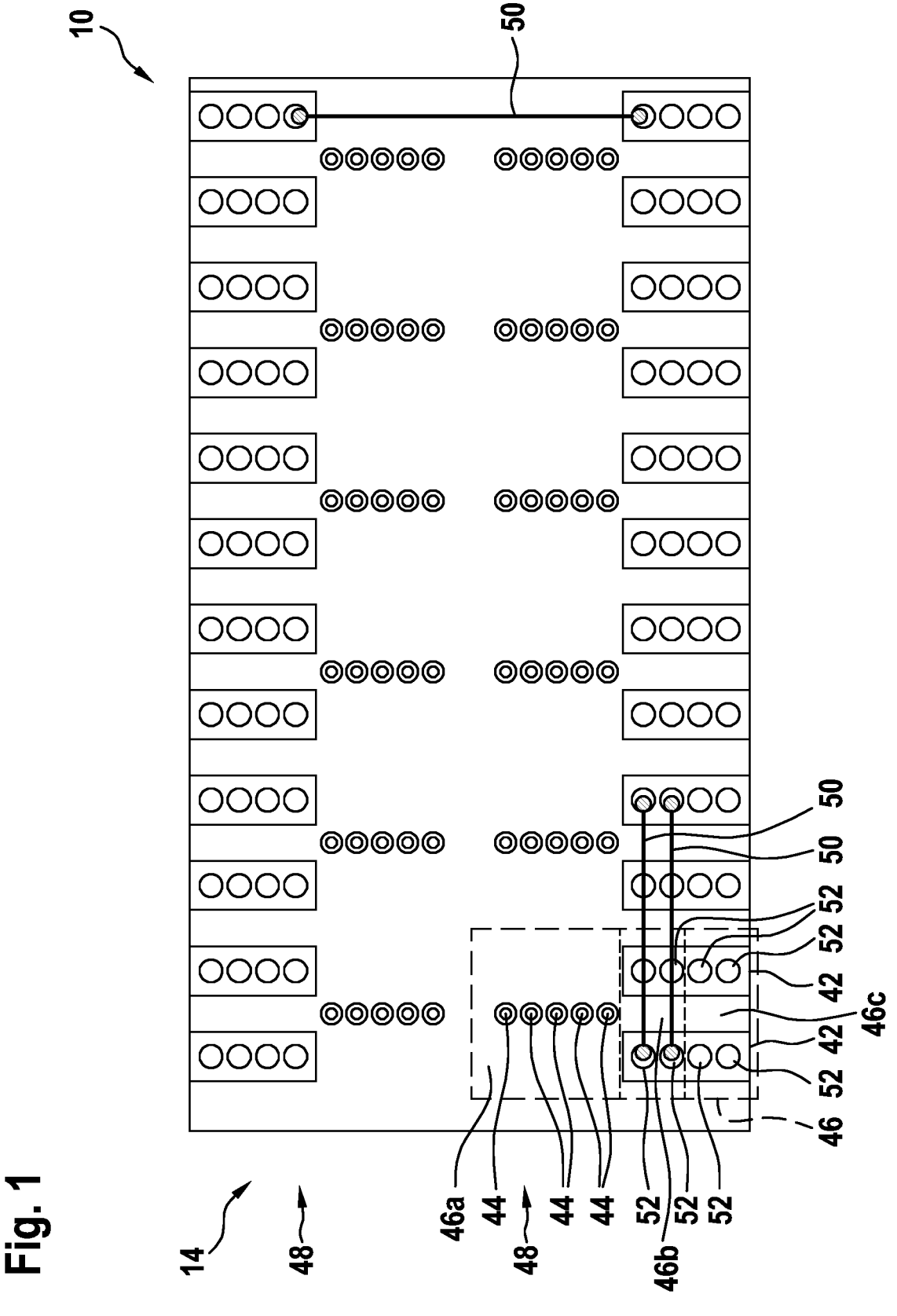
FIG. 1 schematically shows a top view of a power semiconductor module according to an embodiment of the invention.

Embodiments will now be discussed with reference to the drawings. A more detailed discussion of each figure is provided below.

Embodiments of the invention relate to a power semiconductor module 10. A semiconductor module 10 may be a device mechanically and electrically interconnecting two or more semiconductor chips 24 with each other and with terminals that may be exposed by a housing of the module 10. Here and in the following, the term power may relate to the ability of the semiconductor module 10 and/or components of the semiconductor module 10 to process currents of more than 10 A and/or voltages of more than 100 V.

According to an embodiment of the invention, the power semiconductor module 10 comprises at least one semiconductor board 16 with at least two semiconductor chips 24, each semiconductor chip 24 having two power electrodes 26, 28. The semiconductor board 16 may be a substrate 18 with the semiconductor chips 24 bonded to a metallization layer 20 of the substrate 18. The semiconductor board 16 may be a printed circuit board with the semiconductor chips 24 attached thereto.

The semiconductor chips 24 may be controllable devices, such as transistors and/or thyristors. It also may be that some of the semiconductor chips 24 are diodes. The semiconductor chips 24 may be based on Si or SiC or another wide bandgap material. The semiconductor chips 24 may be arranged besides each other in the semiconductor board 16 and/or may be arranged substantially in one layer.

The power electrodes 26, 28 may be an emitter and collector or a source and drain. A controllable semiconductor chip 24 also may comprise a control electrode 30, such as a gate electrode.

According to an embodiment of the invention, the power semiconductor module 10 comprises an adapter board 14 attached to the semiconductor board 16 above the at least two semiconductor chips 24, the adapter board 14 comprising a terminal area for each semiconductor chip 24 on a side facing away from the semiconductor board 16. The adapter board 14 may be attached to the semiconductor board 16 via a housing and/or may be electrically connected to the semiconductor board 16 below. The adapter board 14 may be a printed circuit board, which on one (outer) side comprises terminals and on an opposite (inner) side comprises electrical connections to the semiconductor board 16.

For each semiconductor chip 24, a terminal area may be arranged above the semiconductor area. The terminal areas for different semiconductor chips 24 may be equally designed. The terminal area may provide terminals for individually connecting to every electrode of the semiconductor chip 24 or at least to the power electrodes 26, 28. It may be that the semiconductor chips 24 are electrically and/or galvanically separated from each other in the semiconductor board 16 and the adapter board 14. Solely connections of the terminal may generate electrical connections between the semiconductor chips 24.

According to an embodiment of the invention, the adapter board 14, in each terminal area, provides a power terminal for each power electrode 26, 28 of the semiconductor chip 24 associated with the terminal area. Optionally, also one or more auxiliary terminals 44 for electrical connections to a control electrode 30, to the power electrodes 26, 28 and/or to sensors associated with the semiconductor chip 24 may be provided in the terminal area.

In general, a terminal may be an electrically conducting element to which a further conductor may be attached.

The adapter board 14 may be arranged on top of the semiconductor chips 24 and/or may be bonded to all control and sensor signals of the semiconductor chips 24. The adapter board 14 may enable flexible topology configuration and/or diagnostics signal extraction.

According to an embodiment of the invention, each power terminal for the semiconductor chip 24 associated with the terminal area is electrically connected via an electrical conductive vertical post below the terminal area (and/or below the power terminal) with the semiconductor chip 24. An electrical conductive post may be an elongated straight metal body. The vertical direction may be orthogonal to a plane defined by an extension of the semiconductor board 16 and/or the adapter board 14. The vertical direction also may be orthogonal to a plane, in which the semiconductor chips 24 are arranged. A vertical post directly may end on a power electrode 26, 28 of the chip or on a conductor area provided by the semiconductor board 16 and electrically connected to a power electrode 26, 28.

With the terminal areas, the semiconductor chips 24 in the module 10 may be interconnected in all desired topologies, such as in parallel, in series, in half-bridges, etc. The interconnections may be made with jumpers and/or bridges. Due to the vertical posts 34-40 below the terminal areas, the module 10 may be designed compact, may have a high power density and may have a low stray inductance.

Herein, the term "below" may refer to a projection of the terminal area along the vertical direction towards the semiconductor board 16. When a component is in the projected area, it may be seen as being below the terminal area.

The multichip power semiconductor module 10 may provide separate connections of all power and optional control electrodes 30 of each semiconductor chip 24, wherein all semiconductor chips 24 may be arranged galvanically insulated from each other: This may allow to configure various topologies and/or converter-in-packages. In the case, when also auxiliary terminals are provided, this may additionally allow for advanced per-chip sensing and control.

Examples for different topologies are interleaved topologies, in which the midpoints of several half-bridges are star-connected, multi-phase topologies, half-bridge topologies, full-bridge topologies and/or multi-level topologies, such as NPC bridges. Also adaptive topologies may be possible, for example with a controlled paralleling during operation, which may be used to optimize efficiency with respect to a load profile.

According to an embodiment of the invention, the adapter board 14 provides at least one auxiliary terminal in the terminal area of the semiconductor chip 24 associated with the terminal area, which auxiliary terminal is connected to an electrical conductive vertical post below the terminal area and/or below the auxiliary terminal. An auxiliary terminal may be smaller and/or may have a lower current rating as a power terminal.

According to an embodiment of the invention, the semiconductor chip 24 associated with the terminal area comprise a control electrode 30 and one of the auxiliary terminals is electrically connected with its electrical conductive vertical post with the control electrode 30 of the semiconductor chip 24. The vertical post directly may be connected to a gate electrode of the semiconductor chip 24.

According to an embodiment of the invention, the semiconductor board 16 comprises a sensor 32 for the semiconductor chip 24 associated with the terminal area. The sensor 32 may one of a temperature sensor and a current sensor. The temperature sensor may sense a temperature of the semiconductor chip 24. A current sensor (such as an on-chip current mirror) may sense a load current through the semiconductor chip 24. The sensor 32 may be arranged below the terminal area. An auxiliary terminal 44 may be electrically connected via its electrical conductive vertical post to the sensor 32.

According to an embodiment of the invention, an auxiliary terminal is electrically connected via its electrical conductive vertical post with a power electrode 26 (28) of the semiconductor chip 24 associated with the terminal area. It also may be that such an auxiliary terminal is connected via the adapter board 14 with an electrical conductive vertical post, which also connects the respective power terminal with the respective power electrode 26 (28).

According to an embodiment of the invention, each of the power terminals has at least two plug connectors. A plug connector may be a male or female connector, which is designed to be reversible mechanically and electrically connected with a further plug connector.

The adapter board 14 may comprise jumper connectors for interconnecting two plug connectors for electrically connecting power electrodes 26, 28 of different semiconductor chips 24. The jumper connectors may be seen as jumpers.

However, it also may be possible that power terminals of different chips are connected with bonded interconnections, such as metal strips, lines and/or cables, which may be seen as bridges and/or bridging interconnections.

According to an embodiment of the invention, a power terminal, some of the power terminals or all power terminals are arranged in an outer region of the respective terminal area, wherein the outer region is arranged at a border of the adapter board 14. This part of the power terminal, which may comprise one or more plug connectors, may be used for connecting terminals of the power semiconductor module 10.

According to an embodiment of the invention, at least one auxiliary terminal is arranged in an inner region of the terminal area, wherein the outer region is arranged between the border of the adapter board 14 and the inner region. There may be a second outer region or intermediate region, in which also parts of the power terminals are arranged. The second outer region or intermediate region may be arranged between the first outer region and the inner region.

It may be that the inner region and optionally the second outer region are covered by a gate driver board 12. The gate driver board 12 then may be connected by vertical interconnections with the auxiliary terminals.

The gate driver board 12 may cover the second outer region, in which the power terminals are interconnected with jumpers and/or bridges. With the gate driver board 12, per-chip control and/or diagnostics may be performed. Control signals may be applied to auxiliary terminals interconnected with control electrodes 30. Measurement signals may be received from auxiliary terminals interconnected with power electrodes and/or sensors.

According to an embodiment of the invention, the terminal areas are arranged in at least one row on the adapter board 14. Also, the semiconductor chips 24 may be arranged in one or more rows below the terminal areas. For example, two rows may be arranged mirror symmetric with respect to a central vertical plane of the power semiconductor module 10.

There are several possibilities, how the semiconductor board 16 may be designed. For example, the semiconductor board 16 may be designed based on a substrate 18 with metallization layer, on a printed circuit board and/or chip packages attached to a base plate.

According to an embodiment of the invention, the semiconductor board 16 comprises a substrate 18 with a structured metallization layer to which the at least two semiconductor chips 24 are bonded. The substrate 18 may be made of polymers and/or ceramics and may be covered on one or both sides with a metallization layer. Also one or more separated leadframes are possible as a substrate 18. The metallization layer may be structured, i.e. divided into several areas, which may be used for connecting and/or bonding one or more semiconductor chips 24 and/or the vertical posts 34-40.

According to an embodiment of the invention, the vertical posts 34-40 are pins, which are connected to the adapter board 14 and pressed onto contact areas provided by the semiconductor board 16. It also may be that a head of each vertical post is bonded to the respective contact area of the semiconductor board 16. The contact areas may be an electrode of the semiconductor chip 24 itself or may be provided by a part of the metallization layer.

The adapter board 14 may be a printed circuit board, with a pin grid bonded to its substrate 18. The pins and/or vertical posts may be provided by the pin grid. The pin grid may be bonded to the semiconductor board 16. The bonding may be realized for example by a sintering, soldering or conductive adhesive bonding, for example by an adhesive cap on the pins.

According to an embodiment of the invention, the semiconductor board 16 comprises a chip-scale package 64 for each semiconductor chip 24. Each chip-scale package 64 may comprise at least one semiconductor chip 24, the vertical posts connected to the semiconductor chip 24 (for example electroplated vias and redistribution layers), and a mold or PCB encapsulation 66 into which the semiconductor chip 24 and the vertical posts are embedded. Each chip-scale package 64 also may provide bond areas, to which the vertical posts are electrically connected, wherein the adapter board 14 is bonded to the bond areas of the chip-scale packages 64. The chip-scale packages 64 may be attached to a common baseplate of the module 10. The bond areas may be provided on an upper surface of the chip-scale packages 64, which may be arranged all in the same plane.

The semiconductor chips 24 may be pre-packed in a chip-scale chip package 64 with bond areas on the topside to which the adapter board 14 may be bonded, for example by soldering, sintering or conductive adhesive bonding.

According to an embodiment of the invention, the adapter board 14 and the semiconductor board 16 are provided by a multilayer circuit board, in which the at least two semiconductor chips 24 are embedded. It also may be that the semiconductor board 16 alone is provided by a multilayer circuit board. In both cases, the vertical posts may be provided as through-vias of the multilayer circuit board, which through-vias may go through a plurality of layers of the multilayer circuit board 14/16.

A multilayer circuit board may be made of several polymeric layers with electrical conducting layers between and/or on one or both sides, which are laminated together. The semiconductor chips 24 may be embedded into the multilayer circuit board during the lamination process.

According to an embodiment of the invention, the power semiconductor module 10 comprises a gate driver board 12 attached to the adapter board 14, wherein vertical pins interconnect the gate driver board 12 with auxiliary terminals on the adapter board 14. The gate driver board 12, which may be a printed circuit board, may process measurement signals from the semiconductor chips 24 and/or may generate control signals applied to the semiconductor chips 24. The gate driver board 12 may be attached onto/into the adapter board 14.

According to an embodiment of the invention, the gate driver board 12 covers solely a part of the power terminals of the terminal areas, for example solely power terminals in inner regions. For example, the gate driver board 12 may cover regions, in which the power terminals of different semiconductor chips 24 are interconnected and/or regions, in which the auxiliary terminals are arranged.

As discussed, the power semiconductor module 10 provides power terminals and optionally auxiliary terminals to all of the semiconductor chips 24 of the module separately. With the exposed terminals, each semiconductor chip 24 may be tested individually in factory and/or service.

Due to the vertical posts, a maximum power density may be reached with a minimal substrate 18 area, no space for wirebond may be needed, symmetric heat spreading and better reliability may be achieved. Furthermore, the vertical posts may result in a low inductance and symmetric electromagnetic design.

The figures will now be discussed in further detail.

Figure 2:
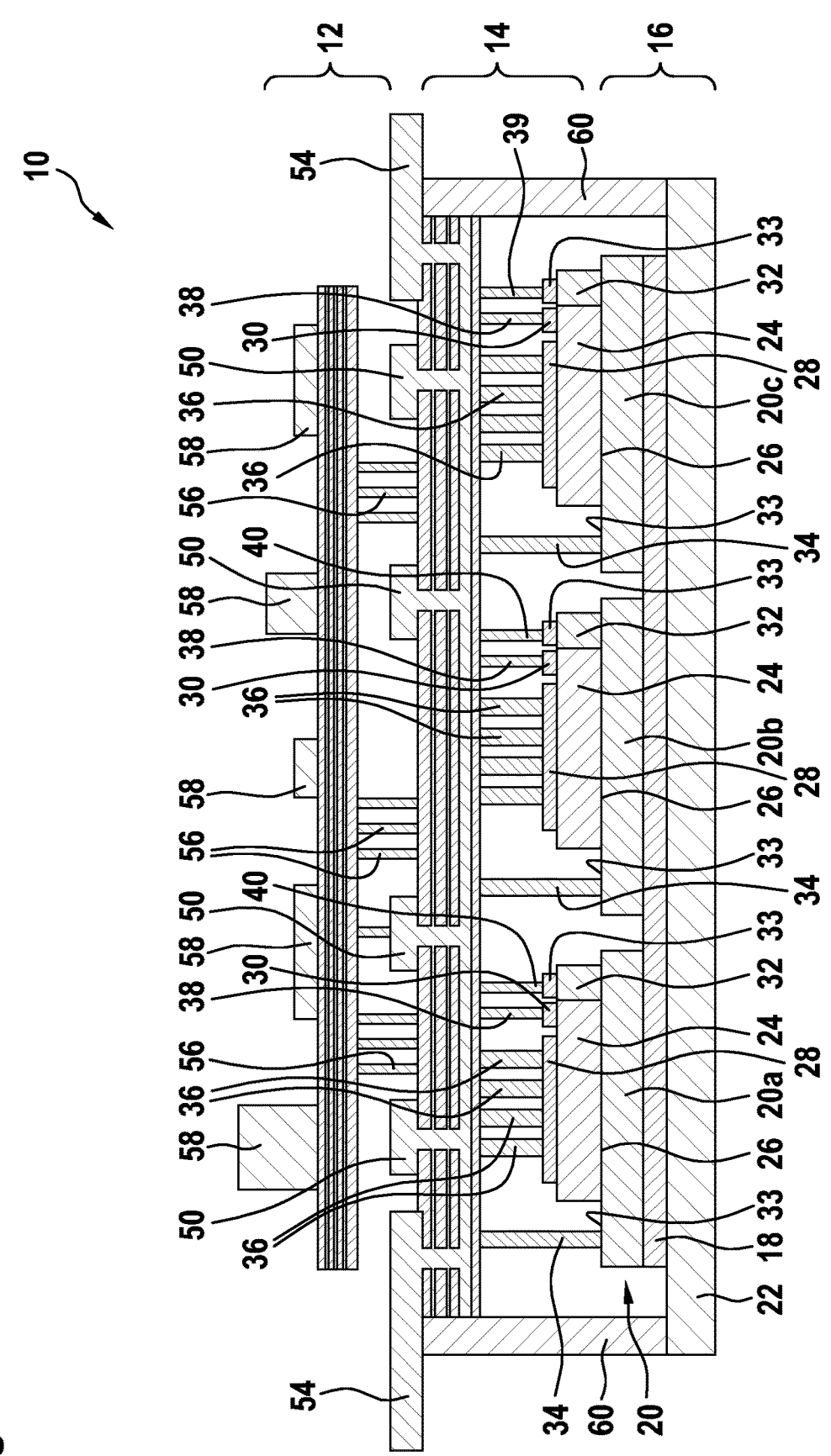
FIG. 2 schematically shows a cross-section through a power semiconductor module according to a further embodiment of the invention.

FIG. 1 shows a top view on a power semiconductor module 10, while FIG. 2 shows a cross-sectional view of the power semiconductor module 10, on which a gate driver board 12 has been attached.

As shown in FIG. 2, the module 10 is composed of the gate driver board 12, which is attached to an adapter board 14, which is attached to a semiconductor board 16.

The semiconductor board 16 may comprise a substrate 18 with one or more metallization layers 20, 22, such as a DBC (direct bonded copper) substrate or an IMS (insulated metal substrate). The metallization layer 20 may be structured into areas 20a, 20b, 20c, which are galvanically isolated from each other with respect to the semiconductor board 16. On the area 20a, 20b 20c, a semiconductor chip 24 is bonded with a first power electrode 26. The opposite side of each of the semiconductor chips 24 provides a second power electrode 28 and a control electrode 30. For example, the semiconductor chips 24 may be Si and/or SiC devices, such as transistors and/or thyristors.

It may be that one or more sensors 32 are incorporated and/or attached to a semiconductor chip 24, which, for example, may sense a temperature of the semiconductor chip 24 and/or a current through the semiconductor chip 24. Such a sensor 32 may provide a contact area 33 facing the adapter board 14. Also the electrodes 28, 30 and parts of the areas 20a, 20b, 20c not covered by a chip 24 also may be seen as contact areas facing the adapter board 14. The one or more sensors 32 may be onboard sensors of the respective semiconductor chip 24, i.e. may be integrated into the respective semiconductor chip 24.

The adapter board 14, which may be a printed circuit board, such as a metal-core PCB and/or flexible PCB, comprises electrically conducting vertical posts 34, 36, 38, 40 on a side facing the semiconductor board 16. The posts 34, 36, 38, 40 may electrically interconnect the adapter board 14 with contact areas 28, 30, 33 of the semiconductor board 14.

On the opposite side, which is shown in FIG. 1, the adapter board 14 comprises power terminals 42 and auxiliary terminals 44. The terminals 42, 44 are arranged in terminal areas 46, which are arranged above the respective semiconductor chip 24. In FIG. 1, only one terminal area 46 and the terminals within are depicted. However, it is shown that the module 10 has two rows 48 of terminal areas 46.

In each terminal area 46, one power terminal 42 may be electrically connected via one or more posts 34 with the respective area 20a, 20b, 20c and the corresponding power electrode 26. One power terminal 42 may be electrically connected via one or more posts 36 directly with the other power electrode 28. An auxiliary terminal 44 may be electrically connected via the post 38 directly with the control electrode 30. An auxiliary terminal 44 may be electrically connected via the post 40 directly with the sensor 32. It also may be that an auxiliary terminal 44 is connected via the adapter board 14 with one of the power electrodes 28, 30.

The semiconductor chips 24 may be interconnected into different topologies with connectors 50 interconnecting the power terminals 44 of different semiconductor chips 24. It may be that the power terminals 44 comprises plug connectors 52 and that the connectors 50 are jumper connectors that may be plugged into these plug connectors 52. It also may be that the connectors 50 are bridges, which are bonded with their ends to the power terminals 42. With the connectors 50, the semiconductor chips inside the module 10 may be interconnected into different topologies, such as in series, in parallel, into half-bridges, etc.

Each terminal area 46 may be divided into an inner region 46a, in which the auxiliary terminals 44 are arranged, an intermediate region 46b, in which an inner part of the power terminals 42 is arranged and an outer region 46c, in which an outer part of the power terminals 42 is arranged.

The outer region 46c may be provided at a border of the adapter board 14 and the outer part of the terminals 42 (and optionally the plug connectors 52 in this outer part) may be used for connecting the module terminal 54 with the power terminals 42 (see FIG. 2).

The inner part of the terminals 42 (and optionally the plug connectors 52 in this part) in the intermediate region 46b, between the outer region 46c and the inner region 46a, may be used for interconnecting semiconductor chips 24 with each other.

In the inner region 46a, the gate driver board 12 may be connected with the auxiliary terminals 44.

Returning to FIG. 2, the auxiliary terminals may comprise press-fit plugs, into which pins 56 protruding from the gate driver board 12 may be plugged. The pins 56, analogously to the vertical posts 34, 36, 38, 40, may be aligned vertically with respect to the boards 12, 14, 16 and/or may protrude from a side of the gate driver board 12 facing the adapter board 14. On an opposite side, the gate driver board 12 may comprise gate driver components 58, such as control components, components for evaluating sensor signals and/or passive elements, such as capacitors and resistors.

The gate driver board 12 may be smaller as the adapter board 14 and/or solely may cover the adapter board 14 in the inner regions 46a and the intermediate regions 46b of the terminal areas 46.

FIG. 2 also shows that the adapter board 14 and the semiconductor board 16 may be mechanically interconnected with each other via a housing 60, which may be glued to the adapter board 14 and the semiconductor board 16.

Figure 4:
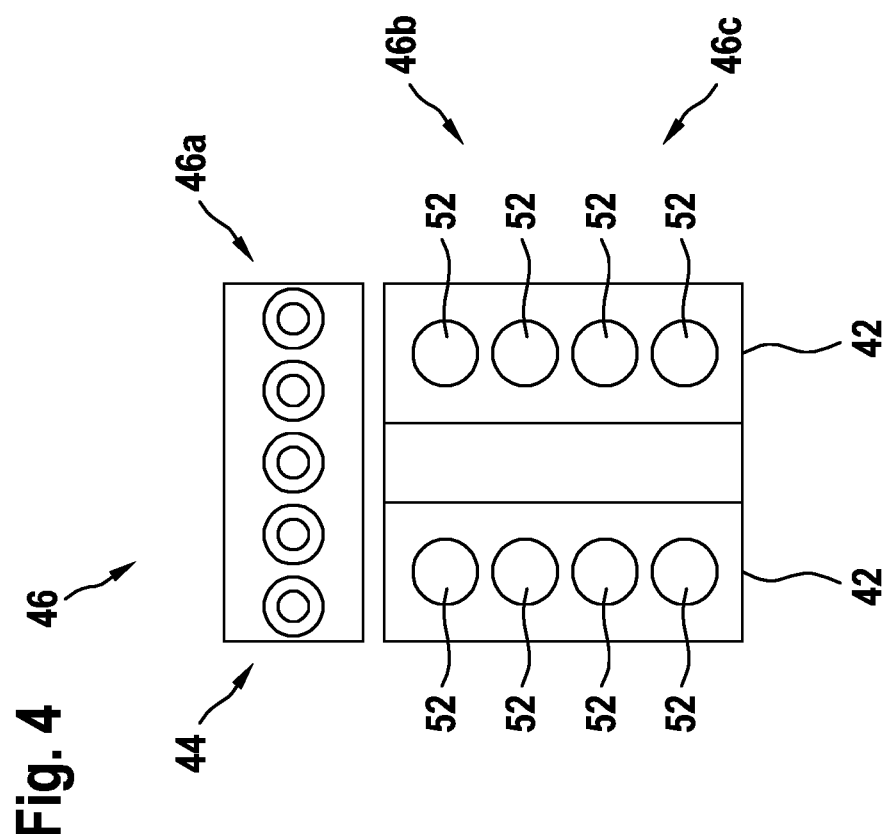
FIG. 4 schematically shows a top view of a part of a power semiconductor module according to an embodiment of the invention.
Figure 3:
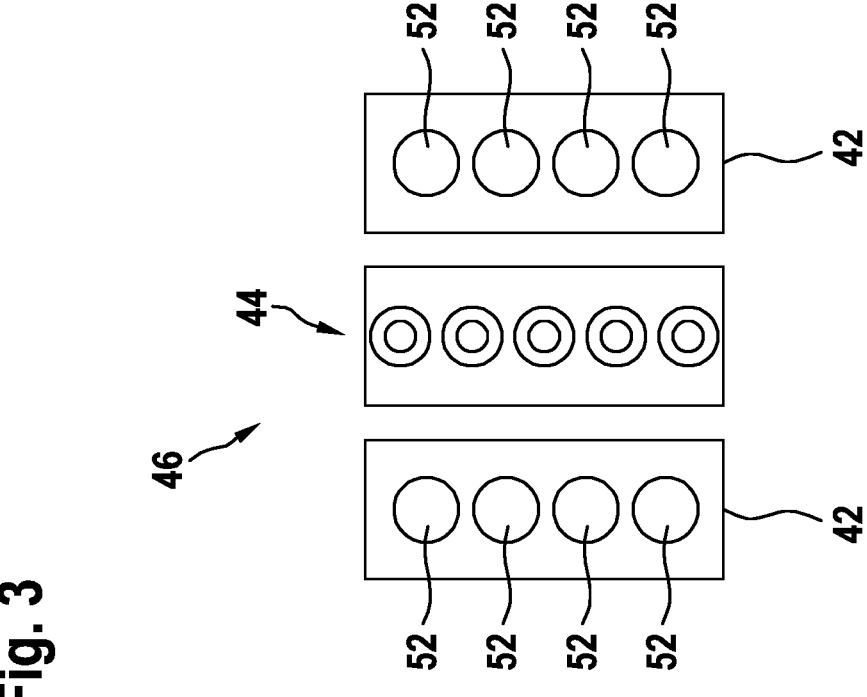
FIG. 3 schematically shows a top view of a part of a power semiconductor module according to an embodiment of the invention.

FIGS. 3 and 4 show possibilities of different terminal areas 46. In general, the plug connectors 52 of the power terminals 42 may be arranged in two parallel rows. Also, the auxiliary terminals 44 may be arranged in one row, which may be parallel to the power terminals 42. As shown in FIGS. 1 and 4, the auxiliary terminals 44 may be arranged besides both power terminals 44. However, as shown in FIG. 3, the auxiliary terminals 44 also may be arranged between the power terminals.

Figure 5:
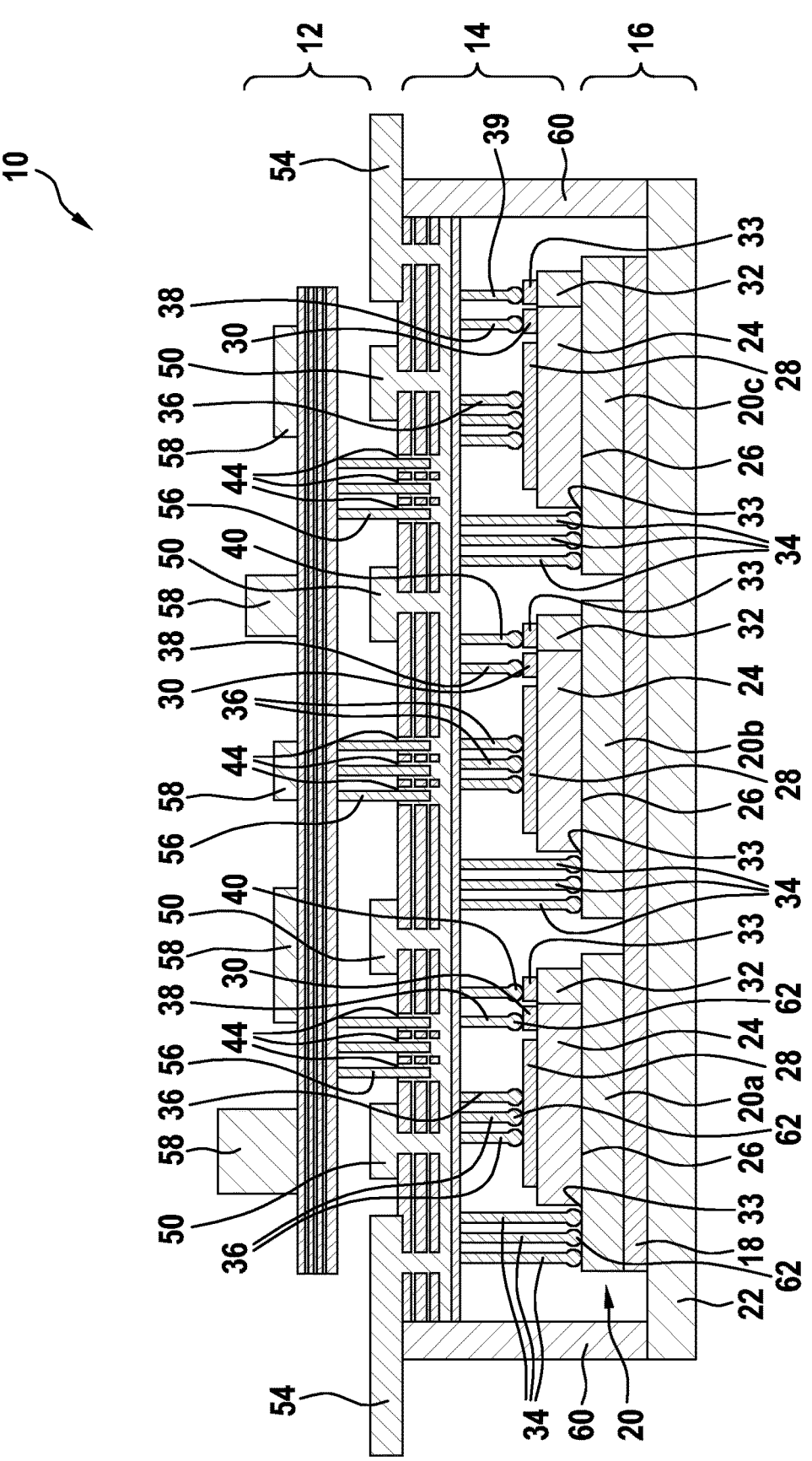
FIG. 5 schematically shows a cross-section through a power semiconductor module according to a further embodiment of the invention.
Figure 7:
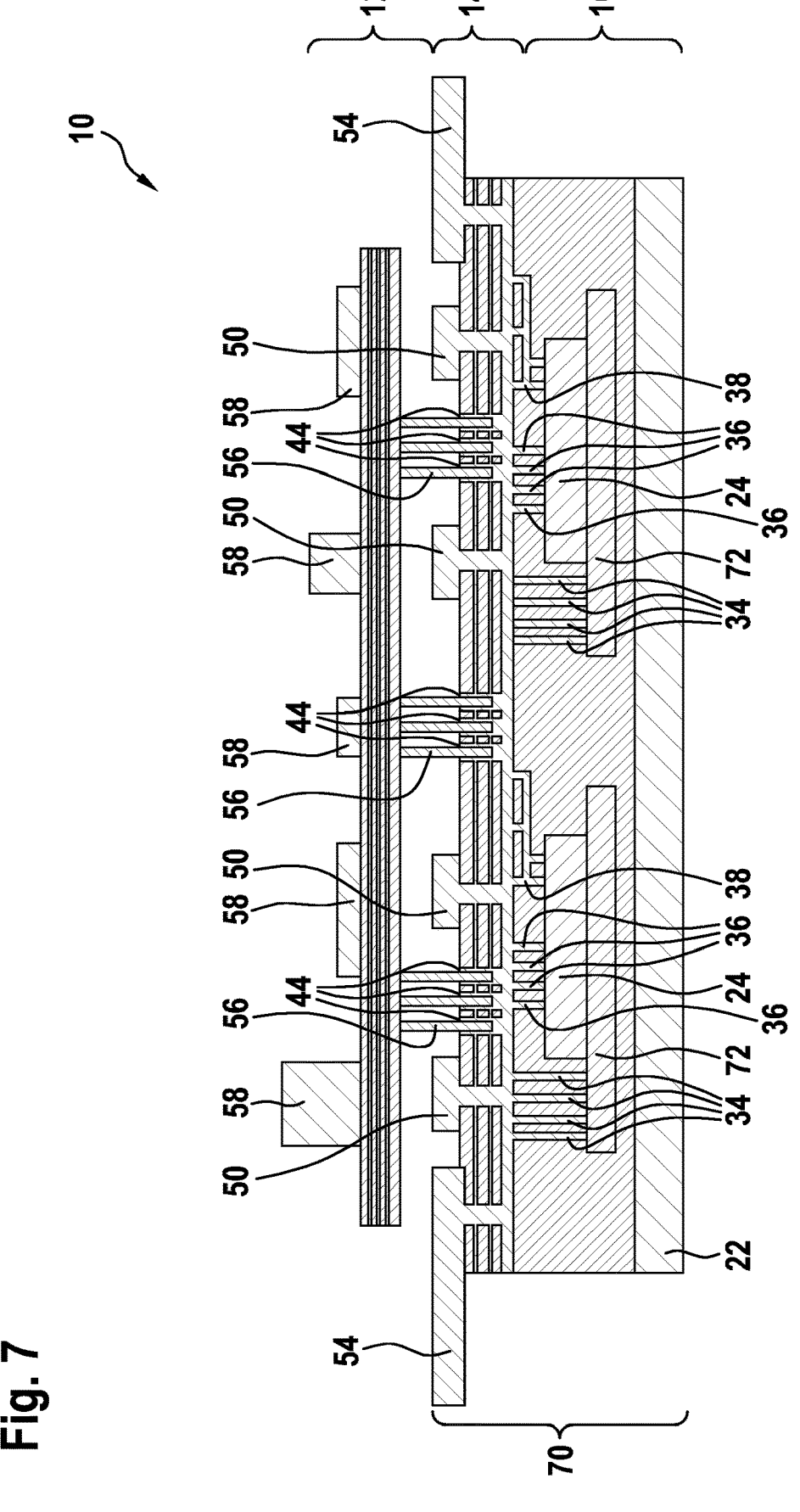
FIG. 7 schematically shows a cross-section through a power semiconductor module according to a further embodiment of the invention.

FIG. 5 shows that the gate driver board 12 may have a press-fit pin array with pins 56, which may be pressed into the auxiliary terminals 44 designed as press-fit plugs. Furthermore, the vertical posts 34, 36, 38, 40 may be pins, which are pressed against the contact areas 28, 30, 33. Such pins 34, 36, 38, 40 may have a head and/or cap 62 adapted for being sintered to the respective contact area 28, 30, 33. For example, the pins 34, 36, 38, 40 may be made of Cu with a sinter cap made of Ag.

The interior of the module 10 between the adapter board 14, the semiconductor board 16 and the housing 60 may be filled with a gel and/or potted with a resin.

The module of FIG. 5 may be manufactured by firstly pick and place the chips 24 on the substrate 18 and then sinter them to the metallization layer 20. After that, the adapter board 14 may be aligned and the pins 34, 36, 38, 40 may be sintered. After that, the module may be encapsulated. In the end, for example a customer of the module 10 may press in jumper connectors 50 and the gate driver board 12. This manufacturing may have the benefit that no embedding and/or wafer level processing may be needed.

Figure 6:
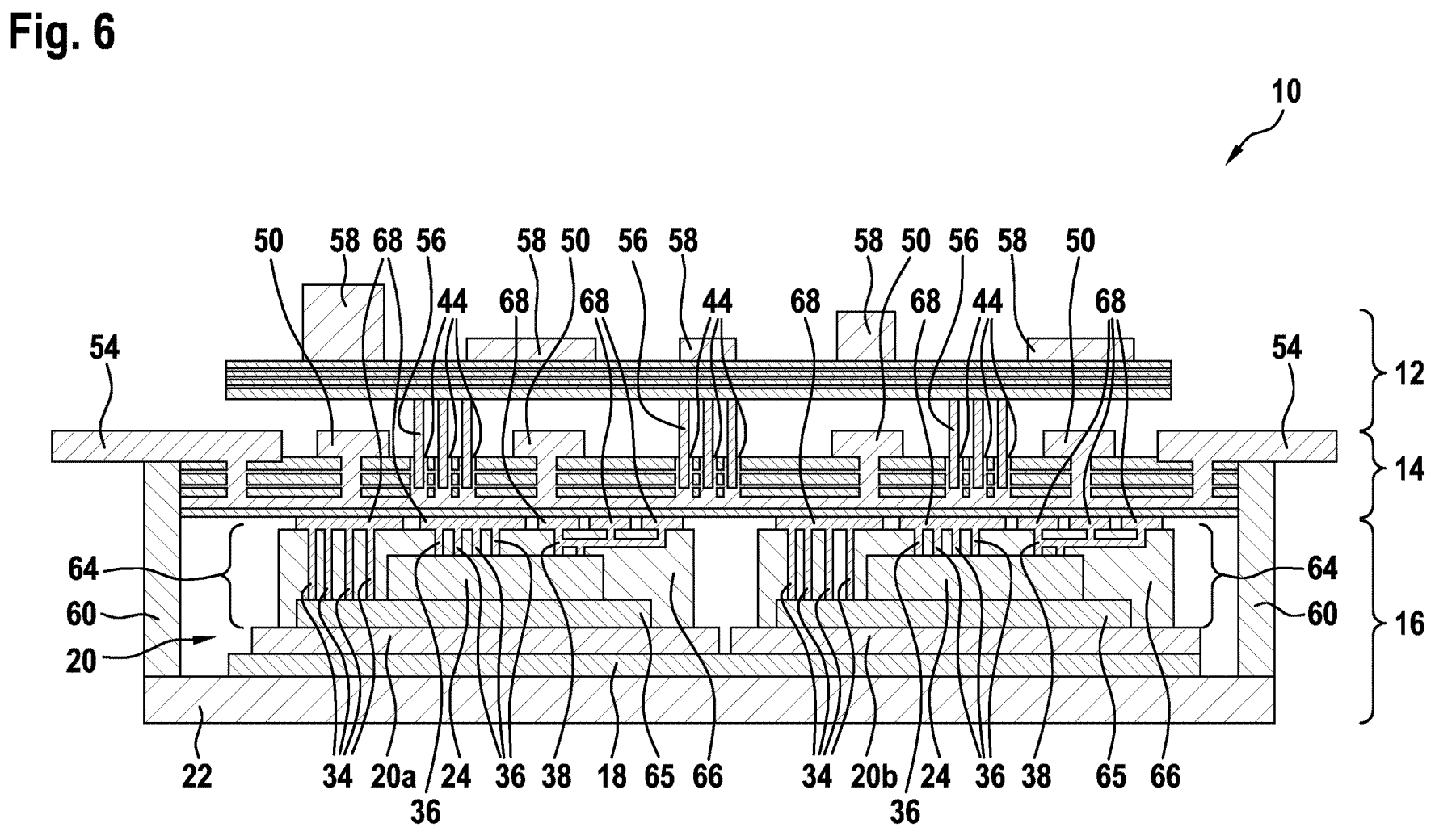

FIG. 6 shows a power semiconductor module 10, in which the semiconductor board 16 comprises a chip-scale package 64 for each semiconductor chip 24. For forming the semiconductor board 16, the chip-scale packages 64 may be bonded to a substrate 18 with a structured metallization layer 20.

Each chip-scale package 64 may comprise one or more of the semiconductor chips 24, the vertical posts (such as electroplated Cu vias and/or redistribution layers) 34, 36, 38, 40 connected to the semiconductor chips 24, and a mold and/or PCB encapsulation 66 into which the semiconductor chip 24 and the vertical posts 34, 36, 38, 40 are embedded. Each chip-scale package also may comprise a leadframe and/or baseplate 65 for bonding the chip package to the substrate 18 of the module 10.

At an opposite side, each chip-scale package 64 may provide bond areas 68, to which the vertical posts 34, 36, 38, 40 are electrically connected. The adapter board 14 then may be bonded to the bond areas 68 of the chip packages 64.

For example, in each chip-scale package 64, a reverse conducting IGBT with onboard temperature and current sensor, an IGBT with freewheeling diode, or two parallel SiC MOSFETs may be accommodated.

The module of FIG. 5 may be manufactured by firstly pick and place the chip-scale packages 64 on the substrate 18 and then bond them to the metallization layer 20. After that, the adapter board 14 may be aligned and bonded to the bond areas. In the end, for example a customer of the module 10 may press in jumper connectors 50 and the gate driver board 12. This manufacturing may have the benefit that no precision issues with respect to aligning the boards may be present and no further encapsulation may be necessary.

FIG. 6 shows a power semiconductor module 10 in which the adapter board 14 and the semiconductor board 16 are provided by a multilayer circuit board 70, in which the at least two semiconductor chips 24 are embedded. The multilayer circuit board 70 may be made of a metal baseplate 22 and a lead frame 72, on which the semiconductor chips 24 are bonded. Polymer insulation layers may be arranged between the metal layers 22, 72. The vertical posts 34, 36, 38, 40 may be provided by through-vias and metallization tracks of the multilayer circuit board 70.

The module of FIG. 6 may be manufactured by pick and place the semiconductor chips 24 in leadframe 72 and sinter them to the leadframe 72. After that, PCB laminate layers may be arranged between the metal layers 22, 72 and the metal layers of the adapter board 14 as well as the other components, such as the through-vias 34, 36, 38, 40, the terminals 42, 44, etc. may be included and all may be laminated together. In the end, for example a customer of the module 10 may press in jumper connectors 50 and the gate driver board 12. This manufacturing may have the benefit that the module may have a rather small height and that only a low number of bonding steps and manufacturing steps at all may be necessary. Furthermore, an additional substrate 18 may not be needed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A power semiconductor module, comprising:
a semiconductor board;
a plurality of semiconductor chips attached to the semiconductor board, each semiconductor chip having two power electrodes;
an adapter board attached to the semiconductor board above the semiconductor chips, the adapter board comprising a terminal area for each semiconductor chip on a side facing away from the semiconductor board, wherein the adapter board, in each terminal area, provides a power terminal for each power electrode of the semiconductor chip associated with the terminal area;

a plurality of electrical conductive vertical posts, wherein each power terminal is electrically connected via a respective vertical post below the terminal area with a respective semiconductor chip;
a plurality of plug connectors, wherein each of the power terminals has at least two plug connectors; and
a plurality of jumper connectors interconnecting the plug connectors for electrically connecting power electrodes of different semiconductor chips.

2. The power semiconductor module of claim 1, wherein at least one of the power terminals is arranged in an outer region of a respective terminal area, wherein the outer region is arranged at a border of the adapter board.

3. The power semiconductor module of claim 2, further comprising an auxiliary terminal arranged in an inner region of the terminal area, wherein the outer region is arranged between the border of the adapter board and the inner region.

4. The power semiconductor module according to claim 1, wherein the terminal areas are arranged in at least one row on the adapter board.

5. The power semiconductor module according to claim 1, wherein the semiconductor board comprises a substrate with a structured metallization layer to which the semiconductor chips are bonded.

6. The power semiconductor module of claim 5,
wherein the vertical posts are pins that are connected to the adapter board such that the pins are pressed onto contact areas provided by the semiconductor board; and
wherein a head of each vertical post is bonded to the respective contact area of the semiconductor board.

7. The power semiconductor module of claim 1,
wherein the semiconductor board comprises a chip-scale package for each semiconductor chip;
wherein each chip-scale package comprises at least one of the semiconductor chips, the vertical posts connected to the at least one of the semiconductor chips, and a mold encapsulation into which the at least one of the semiconductor chips and the vertical posts are embedded;
wherein each chip package provides bond areas, to which the vertical posts are electrically connected; and
wherein the adapter board is bonded to the bond areas of the chip-scale packages.

8. The power semiconductor module of claim 1, further comprising a gate driver board attached to the adapter board, wherein vertical pins interconnect the gate driver board with auxiliary terminals on the adapter board.

9. The power semiconductor module of claim 8,
wherein the adapter board and the semiconductor board are provided by a multilayer circuit board;
wherein the plurality of semiconductor chips are embedded in the multilayer circuit board; and
wherein the vertical posts are through-vias of the multilayer circuit board.

10. The power semiconductor module of claim 8, wherein the gate driver board covers solely a part of the power terminals of the terminal area.

11. The power semiconductor module of claim 1, wherein the semiconductor board comprises a plurality of semiconductor boards, each semiconductor board comprising a plurality of the semiconductor chips.

12. A power semiconductor module, comprising:
a semiconductor board;
a plurality of semiconductor chips attached to the semiconductor board, each semiconductor chip having two power electrodes;
an adapter board attached to the semiconductor board above the semiconductor chips, the adapter board comprising a terminal area for each semiconductor chip on a side facing away from the semiconductor board, wherein the adapter board, in each terminal area, provides a power terminal for each power electrode of the semiconductor chip associated with the terminal area, wherein the adapter board provides an auxiliary terminal in the terminal area of a semiconductor chip associated with the terminal area;

a plurality of electrical conductive vertical posts, wherein each power terminal is electrically connected via a respective vertical post below the terminal area with a respective semiconductor chip, wherein the auxiliary terminal is connected to an electrical conductive vertical post below the terminal area;

a plurality of plug connectors, wherein each of the power terminals has at least two plug connectors; and a plurality of jumper connectors interconnecting the plug connectors for electrically connecting power electrodes of different semiconductor chips.

13. The power semiconductor module of claim 12, wherein the semiconductor chip associated with the terminal area comprises a control electrode and the auxiliary terminal is electrically connected with by one of the vertical posts with the control electrode of the semiconductor chip.

14. The power semiconductor module of claim 12, further comprising a sensor attached to the semiconductor board, the sensor for the semiconductor chip associated with the terminal area, wherein the auxiliary terminal is electrically connected via an associated electrical conductive vertical post to the sensor.

15. The power semiconductor module of claim 14, wherein the sensor is a temperature sensor or a current sensor.

16. The power semiconductor module of claim 12, wherein the auxiliary terminal is electrically connected via one of the vertical posts with one of the power electrodes of the semiconductor chip associated with the terminal area.

17. The power semiconductor module of claim 12, further comprising a gate driver board attached to the adapter board, wherein vertical pins interconnect the gate driver board with the auxiliary terminals on the adapter board, wherein the gate driver board covers solely a part of the power terminals of the terminal area.

18. A power semiconductor module, comprising:
a multilayer circuit board;
a plurality of semiconductor chips embedded within the multilayer circuit board, each semiconductor chip having two power electrodes and a control electrode;
a plurality of power terminals disposed on a layer of the multilayer circuit board, a power terminal being provided for each power electrode of the semiconductor chip in an associated terminal area;
a plurality of electrical conductive vertical posts, wherein each power terminal is electrically connected via a respective vertical post below the terminal area with a respective semiconductor chip;
a plurality of plug connectors, wherein each of the power terminals has at least two plug connectors; and
a plurality of jumper connectors interconnecting the plug connectors for electrically connecting power electrodes of different semiconductor chips.

19. The power semiconductor module of claim 18, wherein the vertical posts are through-vias of the multilayer circuit board.

20. The power semiconductor module of claim 18, further comprising a gate driver board attached to the layer of the multilayer circuit board, wherein vertical pins interconnect the gate driver board with auxiliary terminals on the layer of the multilayer circuit board, wherein the gate driver board covers solely a part of the power terminals of the terminal area.

* * * * *